(12) United States Patent
Su et al.

(10) Patent No.: US 9,433,086 B2
(45) Date of Patent: Aug. 30, 2016

(54) FLEXIBLE CIRCUIT BOARD WITH TEAR PROTECTION STRUCTURE

(71) Applicant: ADVANCED FLEXIBLE CIRCUITS CO., LTD., Taoyuan County (TW)

(72) Inventors: Kuo-Fu Su, Taoyuan County (TW); Chih-Heng Chuo, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 14/283,372

(22) Filed: May 21, 2014

(65) Prior Publication Data
US 2015/0237716 A1    Aug. 20, 2015

(30) Foreign Application Priority Data
Feb. 20, 2014  (TW) .............................. 103105584 A

(51) Int. Cl.
*H05K 1/02*    (2006.01)
*H05K 1/11*    (2006.01)

(52) U.S. Cl.
CPC ............ *H05K 1/0271* (2013.01); *H05K 1/028* (2013.01); *H05K 1/118* (2013.01); *H05K 1/0277* (2013.01)

(58) Field of Classification Search
CPC .... H05K 1/0271; H05K 1/118; H05K 1/028; H05K 1/0393; H05K 1/189; H05K 3/326; H05K 1/0283

USPC .............. 174/250–268, 117 F, 117 FF, 72 A; 361/748–749, 760
See application file for complete search history.

(56) References Cited

U.S. PATENT DOCUMENTS

| | | | |
|---|---|---|---|
| 6,224,395 B1* | 5/2001 | Dahlen | H05K 1/028 439/67 |
| 7,180,001 B1* | 2/2007 | Lin | H05K 1/028 174/117 F |
| 8,022,308 B2* | 9/2011 | Hu | H05K 1/0219 174/254 |
| 2008/0247297 A1* | 10/2008 | Nishidate | G11B 7/08582 369/112.01 |
| 2010/0294556 A1* | 11/2010 | Chuo | H05K 1/028 174/268 |
| 2011/0122323 A1* | 5/2011 | Kim | H01R 12/50 348/739 |
| 2011/0266050 A1* | 11/2011 | Su | H02G 3/0481 174/74 R |

* cited by examiner

*Primary Examiner* — Ishwarbhai B Patel
(74) *Attorney, Agent, or Firm* — Rosenberg, Klein & Lee

(57) ABSTRACT

Disclosed is a tear protection structure for a flexible circuit board. In an extension section of a flexible circuit board, at least a slit line is formed. The slit line has at least a terminal end from which a stress-diverting cut segment extends. The stress-diverting cut segment is formed by cutting in a cutting direction that defines an angle with respect to an extension direction of the extension section to serve as the tear protection structure of the flexible circuit board. The extension section of the flexible circuit board is foldable along the slit line. The stress-diverting cut segment may further include a tear protection hole formed in a termination end thereof.

11 Claims, 4 Drawing Sheets

FLEXIBLE CIRCUIT BOARD WITH TEAR PROTECTION STRUCTURE

BACKGROUND OF THE INVENTION

1. Field of the Invention

The present invention relates to a structural design of a flexible circuit board, and in particular to a tear protection structure for a flexible circuit board.

2. The Related Arts

In each of a variety of electronic devices that are currently used, due to the amount of transmission through signal cables being increasingly large, the number of signal transmission lines is also ever increased. Among all currently employed techniques of signal transmission lines, flexible circuit boards are the most promising technique at present. The flexible circuit boards are featured for being light in weight and small in volume and are adaptable to assembling conditions for products having various outside configurations for a general purpose of increasing wire density to serve as circuit carrier for signal connection or component assembling. A flexible circuit board can be integrated or connected with active components, passive components, or modularized components and thus the flexible circuit board can also serve as a mechanical feature.

A conventional flexible circuit board is often provided with a tear protection hole formed at a location corresponding to a terminal of wiring in order to prevent the flexible circuit board from be torn off along a slit line of the flexible circuit board due to stretching, folding, extending through a bore, or even maintenance operations. In a conventional flexible circuit board, wire lay-out is generally simple and a large space that is preserved between lines is large enough to accommodate the formation of a large circular hole to serve as the tear protection hole, preventing undesired tearing along a slit line of the flexible circuit board resulting from stretching or folding.

The progress of modern technology allows for complicated wire layouts to be used in a flexible circuit board and thus, the spacing between lines is reduced. The conventional way of forming tear protection hole, which is relatively large, may get interfering with the wire layout on the flexible circuit board. Thus, it is desired to provide a solution that is applicable to a very limited space within a wire layout while helping prevent the occurrence of tear along a slit line of a flexible circuit board resulting stretching, folding, extending through a bore, or a maintenance operation. This is a challenge of researches for the manufacturers of the industry to overcome such a prior art problem.

SUMMARY OF THE INVENTION

Thus, an object of the present invention is to provide a tear protection structure for a flexible circuit board, which comprises a stress-diverting cut segment, which in a condition not causing influence on a limited amount of space for wiring layout, extends from a terminal end of at least one slit line formed in an extension section of the flexible circuit board to prevent tear along the slit line of the flexible circuit board resulting from stretching or folding.

The technical solution adopted in the present invention for overcoming the prior art problems is that in a flexible circuit board having an extension section in which at least a slit line is formed, a stress-diverting cut segment extends from at least a terminal end of the slit line in such a way that the stress-diverting cut segment is formed by cutting in a cutting direction that defines an angle with respect to an extension direction to serve as a tear protection structure of the flexible circuit board.

The stress-diverting cut segment of the flexible circuit board can be linear, curved, or S-shaped. Further, the stress-diverting cut segment may further comprise a tear protection hole formed in a termination end thereof. The tear protection hole serves as a stress stopping structure to provide an enhanced effect of tear protection.

The flexible circuit board has an outer edge that comprises a notch formed therein at a location corresponding to the slit line. The extension section of the flexible circuit board is foldable about the slit line and the notch for folding the flexible circuit board. The extension section of the flexible circuit board can be wrapped around by a spiral member or a wrap-around member.

The flexible circuit board can be one of a flexible flat cable (FFC) and a flexible printed circuit (FPC).

In respect of the efficacy, with the arrangement of the stress-diverting cut segment of the present invention, in a limited space resulting from a complicated wiring layout and reduced line spacing of a flexible circuit board, in a condition of not affecting wiring layout, the stress-diverting cut segment is arranged to comply with wiring layout route but changing direction so as to achieve protection against tear along the slit line of the flexible circuit board caused by stretching, folding, extending through a bore, or a maintenance operation.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
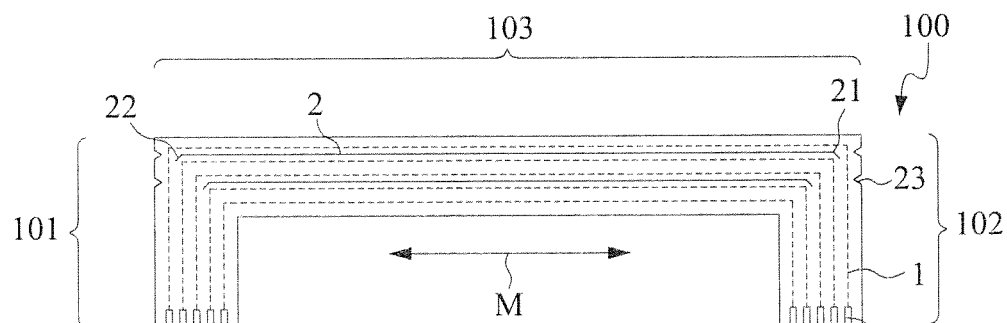
FIG. 1 is a schematic view showing a first embodiment according to the present invention.
Figure 2:
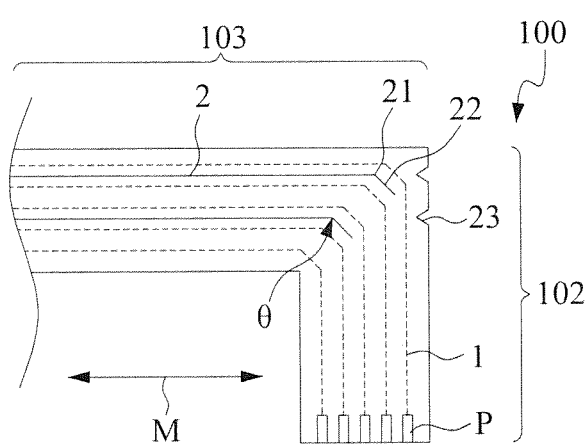
FIG. 2 is an enlarged view showing a portion of FIG. 1.

With reference to the drawings and in particular to FIGS. 1 and 2, of which FIG. 1 is a schematic view showing a first"

embodiment of the present invention and FIG. 2 is an enlarged view showing a portion of FIG. 1, as shown in the drawings, a flexible circuit board 100 comprises a first connection section 101, a second connection section 102, and an extension section 103 connecting between the first connection section 101 and the second connection section 102. The extension section 103 extends in an extension direction M.

The extension section 103 comprises a plurality of conductor lines 1 extending in the extension direction M. The conductor lines 1 are respectively connected to signal terminals P arranged at first and second ends. The conductor lines 1 may include a power line, a grounding line, and signal lines and may alternatively or additionally include at least a pair of differential-mode signal lines 11, 12 that are paired together for transmission of differential-mode signals.

Figure 3:
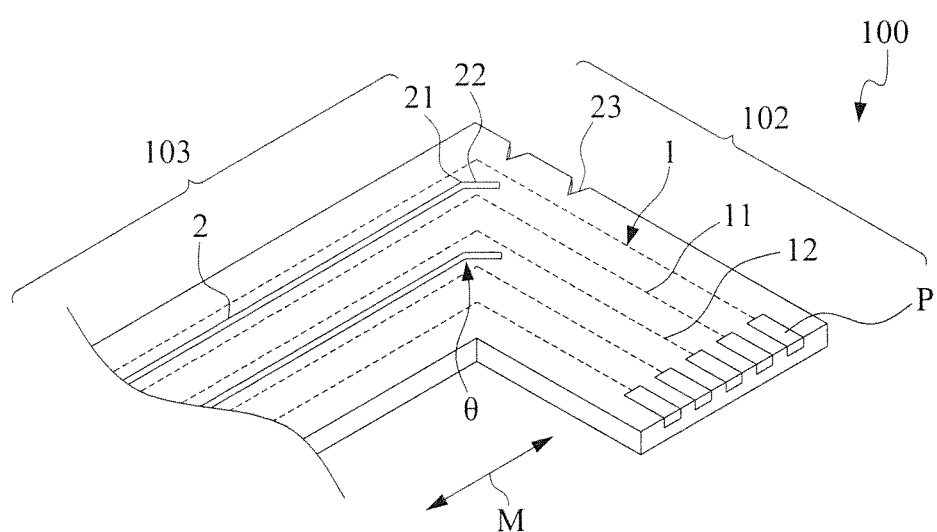
FIG. 3 is an enlarged perspective view showing a portion of FIG. 1.

Also referring to FIG. 3, the extension section 103 comprises at least a slit line 2 formed therein. The slit line 2 extends in the extension direction M and the slit line 2 has two opposite ends each forming a terminal end 21. The flexible circuit board 100 has an outer edge that comprises a notch 23 formed therein at a location corresponding to the slit line 2.

According to the present invention, at least one of the terminal ends 21 of the slit line 2 of the flexible circuit board 100 comprises a stress-diverting cut segment 22 extending therefrom. The stress-diverting cut segment 22 is cut in a cutting direction that defines an included angle θ with respect to the extension direction M and the stress-diverting cut segment 22 terminates at a termination end. The stress-diverting cut segment 22 functions as a tear protection structure of the flexible circuit board 100.

Figure 4:
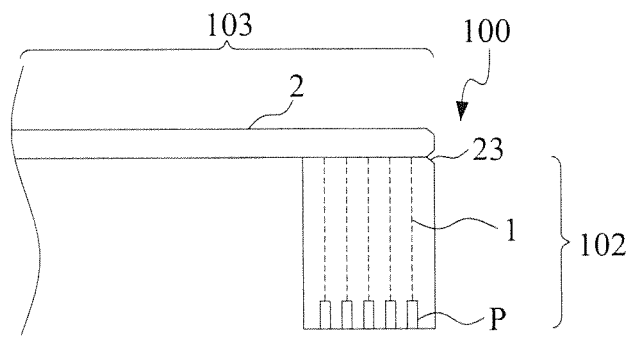
FIG. 4 is a schematic view showing a flexible circuit board in which the present invention is embodied in a folded condition.

Referring to FIG. 4, in a practical application, the slit line 2 and the notch 23 can collectively serve as a fold line along which the extension section 103 can be folded so as to reduce the overall width of the extension section 103 for reducing the amount of space of a circuit design occupied by the extension section 103 in wiring arrangement.

When the slit line 2 of the flexible circuit board 100 is subjected to a folding operation or stretching or simply in a manufacturing process of a product, a stress induced is diverted by the stress-diverting cut segment 22. Without the arrangement of the stress-diverting cut segment 22, the terminal end 21 of the slit line 2 may readily become a stress concentration spot and thus torn off.

Figure 5:
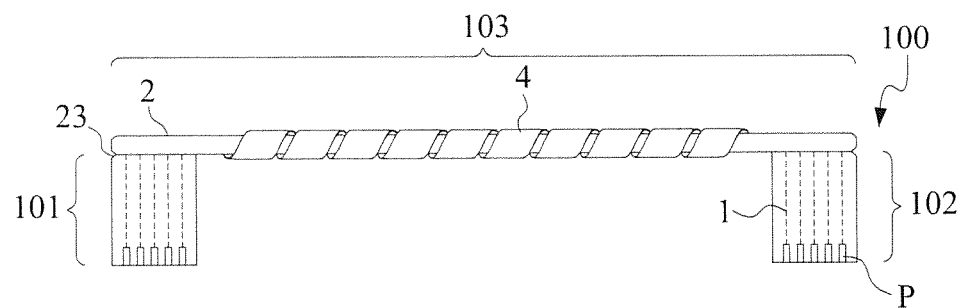
FIG. 5 is a schematic view showing a spiral member wrapping around an extension section of a flexible circuit board.
Figure 6:
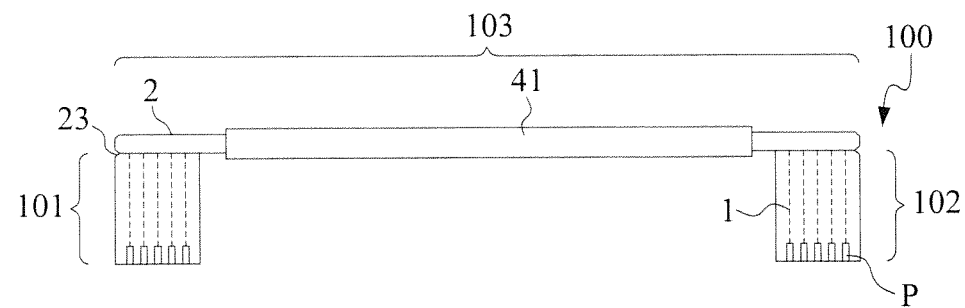
FIG. 6 is a schematic view showing a wrap-around member wrapping around an extension section of a flexible circuit board.

Referring to FIG. 5, when the flexible circuit board 100 is folded along the slit line 2, a spiral member 4 may be used to wrap around the extension section 103 of the flexible circuit board 100 or a wrap-around member 41 may be employed for wrapping (as shown in FIG. 6) for wire management.

Figure 7:
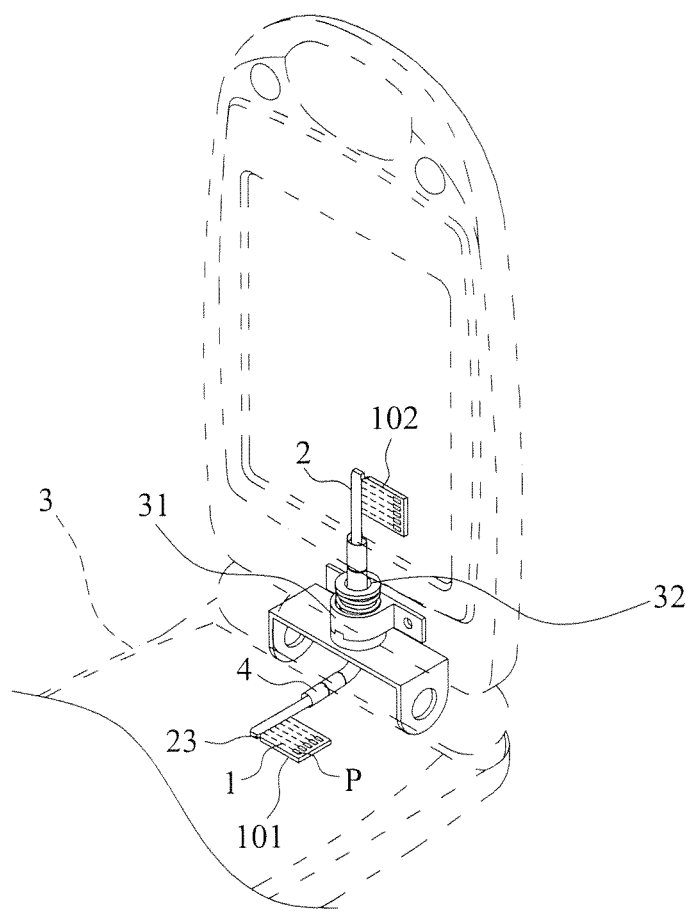
FIG. 7 is a schematic view showing an extension section of a flexible circuit board extending through a bore of a hinge assembly of an electronic device.

Referring to FIG. 7, after the extension section 103 of the flexible circuit board 100 is wrapped around by the spiral member 4 or the wrap-around member 41, the extension section 103 can be passed through a bore 32 of a hinge assembly 31 of an electronic device 3 or a narrow hole of a mechanism.

Figure 8:
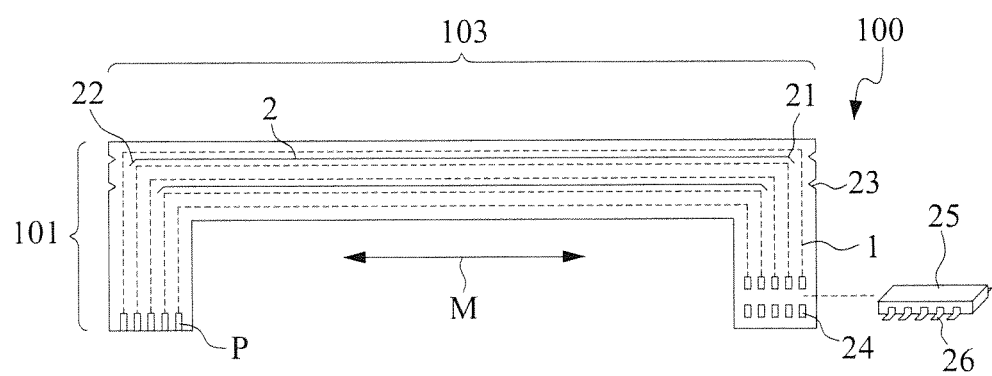
FIG. 8 is a schematic view showing a flexible circuit board having an end on which a plurality of soldering pads is formed to receive soldering pins of an electronic components to be respectively soldered thereto.

In the previous embodiment, both the first connection section 101 and the second connection section 102 of the flexible circuit board 100 are provided with the signal terminals P. It is also feasible as shown in FIG. 8, to arrange a plurality of solder pads 24 in any one or both of the first connection section 101 and the second connection section 102 to receive soldering pins 26 of an electronic component 25 to be respectively soldered to the corresponding ones of the solder pads 24.

Figure 9:
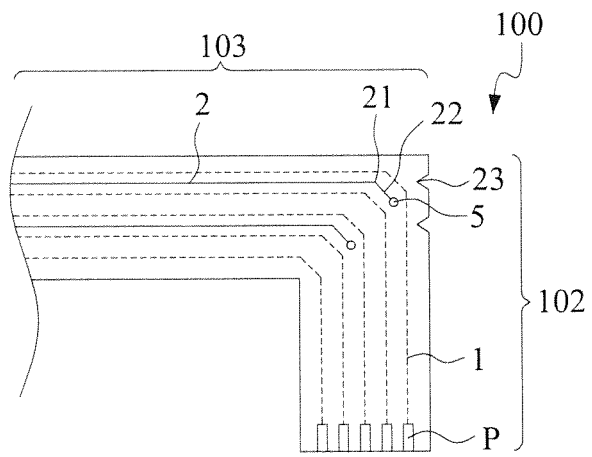
FIG. 9 is a schematic view showing a second embodiment of the present invention.

Referring to FIG. 9, a schematic view is given to show a second embodiment of the present invention, in which the stress-diverting cut segment 22 comprises a tear protection hole 5 formed in the termination end thereof. When the slit line 2 of the flexible circuit board 100 is subjected to a folding operation or stretching or simply in a manufacturing process of a product, besides being diverted by the stress-diverting cut segment 22, a stress induced may be further stopped by the tear protection hole 5 that serves as a stress stopping structure to provide an enhanced effect of tear protection.

Figure 10:
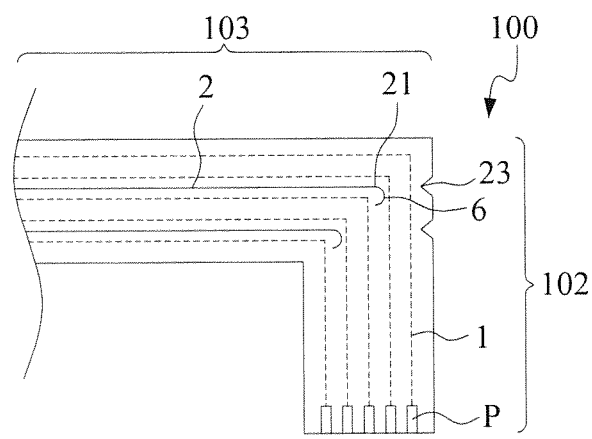
FIG. 10 is a schematic view showing a third embodiment of the present invention.

In the previous embodiments, the stress-diverting cut segment 22 is in the form of a straight line and such a linear stress-diverting cut segment 22 extends in and along an area between two adjacent ones of the conductor lines 1. The stress-diverting cut segment 22 can alternatively be of other configurations. For example, in a third embodiment of the present invention illustrated in FIG. 10, a curved stress-diverting cut segment 6 extends from at least one of the terminal ends 21 of the slit line 2 of the flexible circuit board 100 and can similarly serve as a tear protection structure of the flexible circuit board 100.

Figure 11:
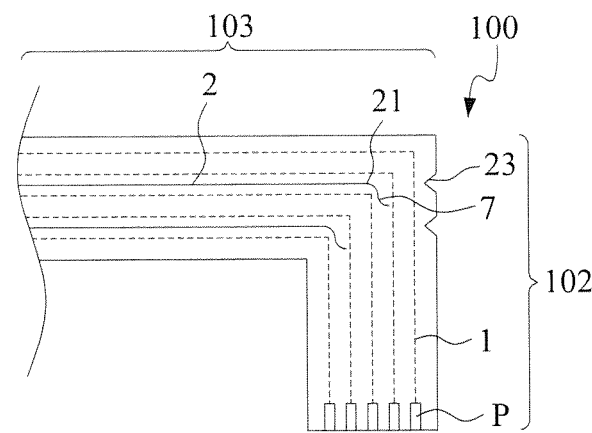
FIG. 11 is a schematic view showing a fourth embodiment of the present invention.

FIG. 11 shows a fourth embodiment of the present invention, in which an S-shaped stress-diverting cut segment 7 extends from at least one of the terminal ends 21 of the slit line 2 of the flexible circuit board 100 and can similarly serve as a tear protection structure of the flexible circuit board 100.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board comprising:
   a first connection section extending in a first connection direction, a second connection section extending in a second connection direction, and an extension section connecting between the first connection section and the second connection section, the extension section extending in an extension direction, the extension section including a plurality of conductor lines extending in the extension direction, the extension section including at least a slit line formed therein, the slit line having an intermediate portion extending in the extension direction between two terminal end portions;
   wherein at least one of the terminal end portions of the slit line of the flexible circuit board includes a stress-diverting cut segment extending therefrom in a cutting direction, the cutting direction being angularly directed to be transverse with respect to both the extension direction and a corresponding one of the first connection direction and the second connection direction, the stress-diverting cut segment being of substantially same width as the intermediate portion of the slit line to form a tear protection structure for the flexible circuit board to divert stress away from the slit line, the flexible circuit board having an outer edge with a notch formed therein at a location corresponding to the slit line and spaced therefrom, the extension section of the flexible circuit board being foldable about the slit line and the notch for folding the flexible circuit board.

2. The flexible circuit board as claimed in claim 1, wherein the stress-diverting cut segment is one of a linear stress-diverting cut segment, a curved stress-diverting cut segment, and an S-shaped stress-diverting cut segment.

3. The flexible circuit board as claimed in claim 1, wherein the extension section of the flexible circuit board is wrapped around by a spiral member.

4. The flexible circuit board as claimed in claim 1, wherein the extension section of the flexible circuit board is wrapped around by a wrap-around member.

5. The flexible circuit board as claimed in claim 1, wherein the flexible circuit board includes one of a flexible flat cable (FFC) and a flexible printed circuit (FPC).

6. The flexible circuit board as claimed in claim 1, wherein the stress-diverting cut segment includes a tear protection hole formed in the termination end thereof.

7. The flexible circuit board as claimed in claim 1, wherein the conductor lines includes at least a pair of differential-mode signal lines for transmission of differential mode signals.

8. The flexible circuit board as claimed in claim 1, wherein the extension section is receivable through a bore of a hinge assembly.

9. The flexible circuit board as claimed in claim 1, wherein one of the first connection section and the second connection section of the flexible circuit board includes a plurality of signal terminals formed thereon.

10. The flexible circuit board as claimed in claim 1, wherein one of the first connection section and the second connection section of the flexible circuit board includes a plurality of solder pads formed thereon.

11. The flexible circuit board as claimed in claim 1, wherein each of the slit line and the at least one stress-diverting cut segment have respective opposing parallel sides.

\* \* \* \* \*